(12) United States Patent
Bessho et al.

(10) Patent No.: US 8,784,638 B2
(45) Date of Patent: Jul. 22, 2014

(54) RESIN BOARD TO BE SUBJECTED TO OZONE TREATMENT, WIRING BOARD, AND METHOD OF MANUFACTURING THE WIRING BOARD

(71) Applicants: Toyota Jidosha Kabushiki Kaisha, Aichi-ken (JP); Kabushiki Kaisha Toyota Jidoshokki, Aichi-ken (JP)

(72) Inventors: Takeshi Bessho, Toyota (JP); Kyoko Kumagai, Kariya (JP); Takashi Yoshida, Kariya (JP); Manabu Osamura, Kariya (JP); Toshihisa Shimo, Kariya (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/654,873

(22) Filed: Oct. 18, 2012

(65) Prior Publication Data

US 2013/0037513 A1 Feb. 14, 2013

Related U.S. Application Data

(62) Division of application No. 12/531,886, filed as application No. PCT/IB2008/001270 on May 21, 2008, now abandoned.

(30) Foreign Application Priority Data

May 22, 2007 (JP) ................................. 2007-135740

(51) Int. Cl.
*C25D 5/56* (2006.01)
*C23C 18/20* (2006.01)
*C23C 18/28* (2006.01)
*H05K 3/38* (2006.01)

(52) U.S. Cl.
USPC .......................... 205/205; 427/99.1; 427/99.5

(58) Field of Classification Search
CPC  C23C 18/20; C23C 18/2006; C23C 18/2046; C23C 18/2053; C23C 18/2066; C23C 18/2073; C23C 18/2086; C23C 18/28; C25D 5/56; H05K 3/381
USPC ................... 205/205; 427/99.1, 99.5
See application file for complete search history.

(56) References Cited

U.S. PATENT DOCUMENTS 4,803,097 A  2/1989 Fraenkel et al.
7,892,651 B2 *  2/2011 Omori et al. ............... 428/473.5
(Continued)

FOREIGN PATENT DOCUMENTS

CN  1849706 A  10/2006
CN  1875130 A  12/2006
(Continued)

OTHER PUBLICATIONS

Chinese Office Action for corresponding Chinese Patent Application No. 200880001135.2 issued on Aug. 27, 2010, 13 pages.

(Continued)

*Primary Examiner* — Nicholas A Smith
(74) *Attorney, Agent, or Firm* — Sughrue Mion, PLLC

(57) ABSTRACT

A resin board that consists of at least one of a mixture of a plurality of types of resins having different degrees of susceptibility to erosion by an ozone solution, and a resin having, in a molecule, a plurality of types of components having different degrees of susceptibility to erosion by the ozone solution is treated with ozone water to form a reformed layer, and a catalyst metal is adsorbed by the reformed layer so as to form a resin-metal composite layer, on which a plating process is performed. In the resin board, a component or components that is/are likely to be eroded on by the ozone solution dissolves into the ozone solution, and pores or clearances on the order of nanometers are formed between the component(s) and a component or components that is/are less likely to be eroded by the ozone solution. With the plating deposited in the pores or clearances, the adhesion strength is improved due to an anchoring effect. Thus, the adhesion strength of the plating film is improved even where the resin-metal composite layer has a thickness of 10 to 200 nm.

3 Claims, 1 Drawing Sheet

(56) References Cited

U.S. PATENT DOCUMENTS

| | | |
|---|---|---|
| 2005/0129895 A1 | 6/2005 | Nakamura |
| 2005/0186434 A1 | 8/2005 | Nakamura |
| 2006/0042954 A1 | 3/2006 | Yoshinaga et al. |
| 2006/0257625 A1 | 11/2006 | Wakizuka |
| 2007/0269665 A1 * | 11/2007 | Shimoohsako et al. ...... 428/458 |

FOREIGN PATENT DOCUMENTS

| | | | |
|---|---|---|---|
| EP | 1 380 671 A1 | | 1/2004 |
| JP | 02-214741 A | | 8/1990 |
| JP | 2001-011296 A | | 1/2001 |
| JP | 2001011296 A | * | 1/2001 |
| JP | 2002-121678 A | | 4/2002 |
| JP | 2002-309377 A | | 10/2002 |
| JP | 2005-005319 A | | 1/2005 |
| JP | 2005-042029 A | | 2/2005 |
| JP | 2005-068497 A | | 3/2005 |
| JP | 2005-217040 A | | 8/2005 |
| JP | 2005-240019 A | | 9/2005 |
| JP | 2006-070319 A | | 3/2006 |
| JP | 2007-087979 A | | 4/2007 |
| WO | 2005/007929 A2 | | 1/2005 |
| WO | WO 2005027221 A1 | * | 3/2005 |

OTHER PUBLICATIONS

Chinese Office Action for corresponding Chinese Patent Application No. CN 200880001135.2 dated Jan. 25, 2011.
Korean Office Action for corresponding KR Patent Application No. 10-2009-7024216 issued on Aug. 4, 2011.
Chinese Office Action in corresponding Chinese Patent Application No. 200880001135.2, dated Sep. 23, 2011.

* cited by examiner

RESIN BOARD TO BE SUBJECTED TO OZONE TREATMENT, WIRING BOARD, AND METHOD OF MANUFACTURING THE WIRING BOARD

INCORPORATION BY REFERENCE

This application is a divisional of U.S. Ser. No. 12/531,886 filed on Sep. 18, 2009, which claims the benefit of Japanese Patent Application No. 2007-135740 filed May 22, 2007, in the Japanese Intellectual Property Office, the disclosures of which are incorporated herein by reference in their entirety.

BACKGROUND OF THE INVENTION

1. Field of the Invention

This invention relates to resin boards for use in wiring boards, wiring boards formed from the resin boards, and a method of manufacturing the wiring boards.

2. Description of the Related Art

Resin is finding remarkably increased use in the fields where metal is conventionally used, owing to its features, such as the ease with which resin can be shaped, a high degree of flexibility in characteristic values, such as strength, and lightness in weight. However, resin also has drawbacks, such as the absence of electrical conductivity and low hardness, and therefore, it has been proposed to combine resin with metal, or the like, so as to eliminate these drawbacks.

As an example of method for providing resin with electrical conductivity, powder of a conductive metal or carbon fibers, for example, is mixed into the resin. However, a large amount of conductive metal needs to be added to the resin so as to impart sufficiently high conductivity to the resin, which may cause adverse influences on the physical properties and increased cost. Thus, another method is known in which a metal film, or a film of a conductive oxide, such as ITO, is formed on a surface of the resin. The conductive film may be formed by a physical method, such as vapor deposition or sputtering, or a chemical method, such as electroless plating. The physical method generally requires large-sized equipment, such as a vacuum tank, and thus suffers from significant restrictions in terms of space or productivity, which undesirably results in increased cost.

In the case where a film of metal is formed on a resin surface by electroless plating, the strength of adhesion between the metal film and the resin is low, and the metal film is likely to peel off from the resin. In view of this problem, the following steps are generally carried out: chemical etching is performed on a resin material so as to make its surface rough, and the etched resin material is then subjected to electroless plating. However, the method that makes the resin surface rough by etching causes a reduction of the surface smoothness, and requires the use of a poisonous or deleterious substance, such as chromic acid, permanganic acid, or sulfuric acid, giving rise to a problem concerned with treatment of waste liquid.

With this being the situation, Japanese Laid-open Patent Publication No. 2002-309377 (JP-A-2002-309377) discloses a method in which a resin material is brought into contact with an ozone solution and is then treated with a solution containing a surface-active agent or surfactant and an alkaline component, and then electroless plating is carried out. According to this method, the cleavage of double bonds on the surface of the resin material takes place due to oxidation caused by ozone, and polar groups are produced on the resin surface. Also, the alkaline component removes an embrittled layer of the resin material, and the surface-active agent is adsorbed by the polar groups. During catalyst treatment prior to electroless plating, a catalyst is adsorbed by the surface-active agent adsorbed on the polar groups. Therefore, metal is likely to be bonded with the polar groups during electroless plating, and the adhesion strength of the resulting electroless-plating film is improved.

JP-A-2005-042029 also proposes a resin board having a resin-metal composite layer, which consists of a resin substrate and the resin-metal composite layer formed integrally on a surface of the resin substrate and having fine metal particles uniformly dispersed in a resin matrix, and a method of manufacturing the resin board.

The resin-metal composite layer of the resin board imparts some characteristics, such as electrical conductivity, wear resistance, light resistance and flame retardancy, to the resin board, and the resin-metal composite layer can be made transparent or translucent. Therefore, the resin board having the resin-metal composite layer can be used in various applications, such as liquid crystal displays and electronic circuit boards. According to the manufacturing method disclosed in JP-A-2005-042029, the resin-metal composite layer can be easily formed without requiring equipment like a vacuum tank, and therefore the resin board can be manufactured in a short time with a reduced number of steps.

In a typical wiring board, a spacing of 100 µm or larger is provided between adjacent wires on the board. In a wiring board of a small-sized high-density component, however, the spacing between adjacent wires on the board needs to be 100 µm or smaller.

In the case where a resin-metal composite layer is formed using the technology disclosed in JP-A-2005-042029, and wires are formed with small spacings (of, for example, 100 µn or less) on the surface of the composite layer by electroless plating, portions of the resin-metal composite layer located between the wires need to be removed by etching in a later process step.

In the meantime, the technology disclosed in JP-A-2005-042029 has a problem that the adhesion strength of the plating film is low if the thickness of the resin-metal composite layer is small, more specifically, is about 20-200 nm. It is thus necessary to make the thickness of the metal-composite layer greater than 200 nm. It is, however, to be noted that the plating film is embedded in the resin after electroless plating. Thus, if a resin-metal composite layer having a thickness greater than 200 nm is formed, it is difficult to completely remove the plating film and resin-metal composite layer between wires even with etching, causing a problem of insufficient or faulty insulation.

SUMMARY OF THE INVENTION

The invention has been developed in view of the above-described situation, and it is therefore an object to improve the adhesion strength of a plating film even where a resin-metal composite layer has a small thickness of 10-200 nm, in the manufacture of a wiring board using a resin board on which the resin-metal composite layer is formed using the technology disclosed in JP-A-2005-042029.

According to one aspect of the invention, a resin board to be subjected to ozone treatment, which is adapted to be treated with an ozone solution, is characterized by comprising at least one of a mixture of a plurality of types of resins having different degrees of susceptibility to erosion by the ozone solution, and a resin having, in a molecule, a plurality of types of components having different degrees of susceptibility to erosion by the ozone solution.

The resin board may contain, for example, an aromatic epoxy resin that has both an aromatic cyanate compound and an epoxy group.

According to another aspect of the invention, a wiring board is characterized by comprising the resin board of the invention, a resin-metal composite layer which is formed integrally on a surface of the resin board and in which fine metal particles are uniformly dispersed in a resin matrix, and a wiring portion consisting of a plating film formed in a predetermined pattern on the resin-metal composite layer, and the resin-metal composite layer has a thickness of 10 to 200 nm.

According to a further aspect of the invention, a method of manufacturing a wiring board is characterized by comprising a preparing step of preparing the resin board of the invention, an ozone treatment step of treating the resin board with an ozone solution so as to form a reformed layer having polar groups on a surface thereof, an adsorption step of bringing the reformed layer into contact with a metal compound solution so that at least one of colloidal particles and ions of a catalyst metal are attached to the polar groups and fine particles of the catalyst metal are dispersed in the reformed layer, thereby to form a resin-metal composite layer, and a plating step of performing a plating process on the resin-metal composite layer in a predetermined pattern so as to form a wiring portion of the predetermined pattern, wherein these steps are carried out in the order of description.

Preferably, the manufacturing method as described above further includes an etching step of removing an unnecessary portion of the resin-metal composite layer.

When the resin board of the present invention is treated with the ozone solution, the component or components that is/are likely to be eroded by the ozone solution may dissolve into the ozone solution, or the cleavage of molecular chains may occur. As a result, pores or clearances on the order of nanometers are produced on a surface of or inside the resin board, between portions formed of the component(s) that is/are likely to be eroded by the ozone solution and portions formed of a component or components that is/are less likely or unlikely to be eroded by the ozone solution. Thus, the strength of adhesion of the resin board to a vapor-deposited film, a coating, an electroless-plating film, or the like, which is subsequently formed on the resin board, is improved owing to the anchoring effect.

In the adsorption step that precedes the electroless plating step, the colloidal particles and/or ions of the catalyst metal are admitted into the pores or clearances formed in the resin board. In the subsequent plating step, therefore, a plating liquid finds its way into the pores or clearances, and a plating film is also formed in the pores or clearances.

Accordingly, in the wiring board produced using the resin board of the invention, the adhesion strength of the plating film is improved due to the anchoring effect even where the resin-metal composite layer has a small thickness, more specifically, a thickness of 10 to 200 nm, Furthermore, the resin-metal composite layer of the wiring board of the invention can impart characteristics, such as electrical conductivity, wear resistance, light resistance and flame retardancy, to the wiring board, and the resin-metal composite layer can be made transparent or translucent. Therefore, the wiring board can be used in various applications, such as liquid crystal displays and electronic circuit boards.

According to the manufacturing method of the present invention, the resin-metal composite layer can be easily formed without requiring equipment, such as a vacuum tank, and the wiring board can be manufactured with a reduced number of steps in a relatively short time. Thus, the wiring board having excellent characteristics as described above can be manufactured with high reliability at reduced cost.

BRIEF DESCRIPTION OF THE DRAWINGS

The features, advantages, and technical and industrial significance of this invention will be better understood by reading the following detailed description of preferred embodiments of the invention, when considered in connection with the accompanying drawings, in which.

DETAILED DESCRIPTION OF THE EMBODIMENTS

Figure 1:
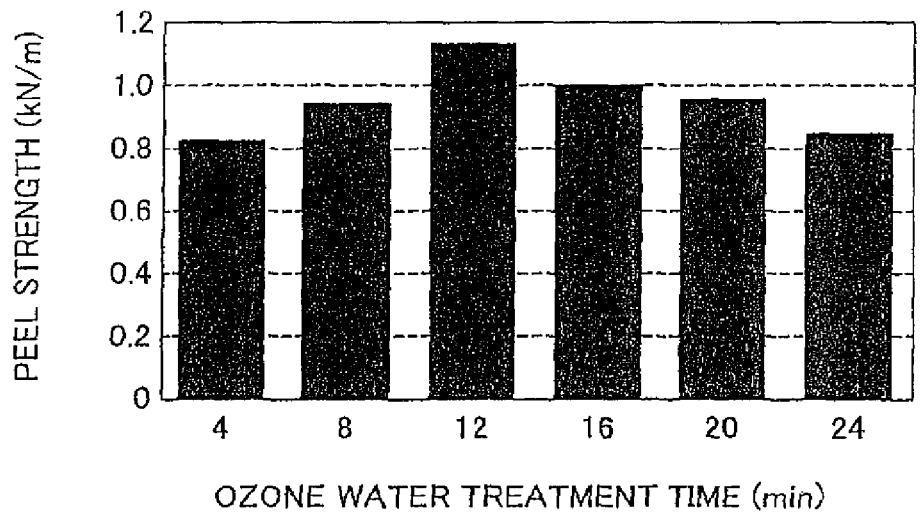
FIG. 1 is a graph showing the adhesion strength of plating films of printed wiring boards obtained in Examples 1 to 6.

In the following description and the accompanying drawings, the present invention will be described in greater detail.

The resin board of the invention consists of at least one of a mixture of two or more types of resins having different degrees of susceptibility to erosion by an ozone solution, and a resin having, in a molecule, two or more types of components having different degrees of susceptibility to erosion by an ozone solution. As a typical example of the resin, a resin containing an aromatic cyanate compound having a cyanato-group and an aromatic epoxy resin having an epoxy group may be used.

Preferable examples of the aromatic cyanate compound having a cyanato-group include bisphenol A dicyanate, polyphenol cyanate (oligo (3-methylene-1, 5-phenylenecyanate)), 4, 4'-methylenebis (2,6-dimethyl-phenylcyanate), 4,4'-ethylidenephenyldicyanate, hexafluorobisphenol A dicyanate, and prepolymers of these compounds part of which is modified into triazine. Each of the above-indicated cyanate compounds may be used alone, or two or more of the cyanate compounds may be used in combination.

The aromatic epoxy resin having an epoxy group means an epoxy resin having an epoxy group in a molecule and also having an aromatic ring structure in a molecule. Preferable examples of the aromatic epoxy resin having an epoxy group include bisphenol A type epoxy resin, bisphenol F type epoxy resin, bisphenol S type epoxy resin, phenol novolak type epoxy resin, alkylphenol novolak type epoxy resin, biphenyl type epoxy resin, dicyclopentadiene type epoxy resin, epoxides of condensation compounds of phenols and aromatic aldehyde having a phenolic hydroxyl group, naphthalene type epoxy resin, triglycidyl isocyanurate, and brominated epoxy resins and phosphorous modified epoxy resins of these compounds. Each of the above-indicated epoxy resins may be used alone, or two or more types of these resins may be used in combination.

An inorganic filler may be added to the resin board of the invention. The inorganic filler may be selected from, for example, silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. In particular, silica is preferably used. The average grain size of the inorganic filler is preferable 5 μm or smaller. If the average grain size exceeds 5 μm, it may be difficult to form a fine pattern with stability when forming a circuit pattern on the resin board. In order to improve the moisture resistance or enhance the adhesion of the inorganic filler to the resin matrix, the inorganic filler is preferably surface-treated with a finishing or coupling agent, such as a silane coupling agent.

In addition to the above-indicated components, other thermosetting resin(s) or thermoplastic resin(s), and additives, may be used as needed in the resin board of the invention, provided that they are not detrimental to the effect of the invention. The thermosetting resin(s) may be selected from, for example, a monofunctional epoxy resin serving as a diluent, alicyclic multifunctional epoxy resin, rubber modified epoxy resin, an acid anhydride compound serving as a curing agent for epoxy resin, block isocyanate resin, xylene resin, and a polymerizing resin serving as a radical generating agent. The thermoplastic resin(s) may be selected from, for example, polyimide resin, polyamide imide resin, polyether imide resin, polysulfone resin, polyether sulfone resin, polyphenylene ether resin, polycarbonate resin, polyether ether ketone resin, and polyether resin. Examples of the additives include organic fillers, such as silicon powder, nylon powder, and fluorine powder, thickening agents, such as orben and bentone, silicone base, fluorine base, and high polymer base antifoaming agents or leveling agents, imidazole base, thiazole base, triazole base compounds, and an agent, such as a silane coupling agent, for improving the adhesiveness.

The resin board as described above may be used in a half-cured state in which the resin is not completely cured. To bring the resin board into the half-cured state, the above-described resin board is subjected to a half-curing heat treatment step in which the resin board is heated at 150° C. for 30 min. With the resin board heated in this manner, reactions between cyanato-groups and epoxy groups proceed to some extent, to thus form the oxazoline structure or triazine rings. By placing the resin board in the half-cured state, the degree of erosion by the ozone solution may be varied, and the relationship between the thickness and adhesiveness of the resin-metal composite layer may be changed to be within a more preferable range. Nonetheless, it is found that even where the resin board is in a fully cured state, a certain degree of adhesion strength can be ensured.

In an ozone treatment step, the resin board is treated with an ozone solution so that a reformed layer having polar groups on its surface is formed. The reformed layer has pores or clearances on the order of nanometers (nm) or smaller, which are formed on a surface of or within the resin board between a component(s) that is/are more likely to be eroded by the ozone solution and a component(s) that is/are less likely to be eroded by the ozone solution. To treat the resin board with the ozone solution, the resin board may be immersed in the ozone solution, or the ozone solution may be applied by spraying to the resin board. It is preferable to immerse the resin board in the ozone solution because ozone is less likely to be released from the ozone solution, as compared with the case where the resin board contacts with the ozone solution applied by spraying.

The ozone concentration in the ozone solution has a great influence on the activation of the resin board surface. While an effect of the activation is observed when the ozone solution is about 10 ppm or higher, the effect of the activation remarkably improves if the ozone solution is 20 ppm or higher, and the treatment can be accomplished in a more shortened time. Through oxidation by ozone contained in the ozone solution, polar groups, such as OH groups, C=O groups, COOH groups, are produced in the reformed layer.

The ozone solution normally has water as a solvent, but preferably has an organic or inorganic polar solvent as a solvent. By using such a solvent, the treatment time can be further shortened. Examples of the organic polar solvent include alcohols, such as methanol, ethanol, and isopropyl alcohol, N, N-dimethyl formamide, N, N-dimethyl acetamide, dimethyl sulfoxide, N-methylpyrrolidone, hexamethylphosphoramide, organic acids, such as formic acid and acetic acid, and mixtures of these compounds with water or an alcohol base solvent. Examples of the inorganic solvent include inorganic acids, such as nitric acid, hydrochloric acid, and hydrofluoric acid.

While the reaction speed increases as the treatment temperature in the ozone treatment step increases in principle, the solubility of ozone in the ozone solution decreases as the temperature increases. To make the ozone concentration in the ozone solution equal to or hither than 40 ppm at a temperature that exceeds 40° C., a pressure equal to or higher than the atmospheric pressure needs to be applied to the treatment atmosphere, which requires large-sized equipment. The treatment temperature may be about the room temperature.

The duration of time that the ozone solution and the resin board are held in contact with each other in the ozone treatment step differs depending on the type of the resin, but is preferably 2 to 30 min. If the contact time is less than 2 minutes, the effect due to the ozone treatment is less likely or unlikely to appear even if the ozone concentration is 20 ppm or higher. If the contact time exceeds 30 minutes, the resin board may deteriorate.

In the ozone treatment step, it is also preferable to irradiate the resin board with ultraviolet rays while the surface of the resin board is held in contact with a high-concentration ozone solution. The ultraviolet rays applied to the resin board preferably has a wavelength of not greater than 310 nm, more desirably, a wavelength of not greater than 260 nm, and even more desirably, a wavelength in a range of about 150 to 200 nm. The irradiation amount of the ultraviolet rays is desirably 50 mJ/cm$^2$ or larger. A light source that can apply such ultraviolet rays to the resin board may be selected from a low-pressure mercury lamp, high-pressure mercury lamp, excimer laser, barrier discharge lamp, and a microwave electrodeless discharge lamp.

To irradiate the resin board with the ultraviolet rays while immersing the resin board in the ozone solution, the ultraviolet rays may be applied from the ultraviolet-ray light source placed in the ozone solution, or the ultraviolet rays may be applied from above the liquid surface of the ozone solution. If the container of the ozone solution is formed of a material, such as transparent quartz, through which ultraviolet rays can pass, the ultraviolet rays can be applied from the outside of the container of the ozone solution.

After the ozone treatment step, it is desirable to conduct a C/C treatment step in which the reformed layer is brought into contact with a cleaner conditioner solution containing at least an alkali component. The alkali component has a function of making the surface of the reformed layer soluble in water at the molecular level, and removes an embrittled layer on the surface of the reformed layer so that an increased number of polar groups appear on the surface, whereby an increased number of fine particles of metal can be formed in the later adsorption step. The alkali component may be selected from those that can remove the embrittled layer by dissolving the surface of the reformed layer at the molecular level, and, more specifically, may be selected from sodium hydroxide, potassium hydroxide, and lithium hydroxide.

It is also desirable that the cleaner conditioner solution further contains a surface-active agent or surfactant. It is considered that the surface-active agent has hydrophobic groups that are likely to be attached to the polar groups present on the reformed layer, and can be thus adsorbed by a large portion of the polar groups. Accordingly, an increased number of metal particles can be formed in the later adsorption step.

The surface-active agent may be selected from those having hydrophobic groups that are likely to be attached to one or more types of polar groups selected from COOH, C=O and C—OH. Examples of the surface-active agent include sodium lauryl sulfate, potassium lauryl sulfate, sodium stearyl sulfate, potassium stearyl sulfate, and polyoxyethylene dodecyl ether.

While a polar solvent, a typical example of which is water, is desirably used as a solvent of the cleaner conditioner solution containing the surface-active agent and the alkali component, an alcohol base solvent or a solvent containing a mixture of water and alcohol may also be used in some cases. To bring the reformed layer into contact with the cleaner conditioner, the resin board may be immersed in the cleaner conditioner solution, or a coating of the cleaner conditioner solution may be applied to the reformed layer.

The concentration of the surface-active agent in the cleaner conditioner solution is preferably controlled to be within a range of 0.01 to 10 g/L. If the concentration of the surface-active agent is lower than 0.01 g/L, the amount of metal particles to be produced is reduced. If the concentration of the surface-active agent is higher than 10 g/L, the reformed layer and the surface-active agent are brought into an association state, and an excess surface-active agent remains as an impurity, whereby the amount of metal particles to be produced is reduced. In this case, the resin board may be washed with water, so that the excess surface-active agent may be removed.

The concentration of the alkali component in the cleaner conditioner is desirably 10 or greater in pH. Although a reasonable effect can be obtained even if the pH value is 10 or less, it takes time for the alkali component to remove the embrittled layer on the surface of the reformed layer. If the pH value is 10 or greater, the process of removing the embrittled layer is accomplished in a shorter time.

While there is no limitation to the duration of time that the cleaner conditioner solution and the reformed layer are held in contact with each other, it is preferable to hold the cleaner condition and the reformed layer in contact with each other at 10° C. for 1 min. or longer. If the contact time is too short, the amount of the surface-active agent attached to the polar groups may be insufficient. If the contact time is too long, however, the cleaner conditioner solution may dissolve a layer on which the polar groups appear, as well as the embrittled layer. Thus, about 1 to 10 minutes is a sufficient or adequate duration of time for contact between the cleaner condition solution and the reformed layer. With regard to the temperature at which the conditioner solution and the reformed layer are held in contact with each other, a higher temperature is more desirable, and the contact time can be shortened as the temperature is higher. It is, however, to be noted that about 10 to 70° C. is a sufficient or adequate temperature range.

In the C/C treatment step, the surface-active agent may be adsorbed by the reformed layer after the reformed layer is treated with a cleaner conditioner solution containing only the alkali component. In this case, however, an embrittled layer may be formed again by the time that the surface-active agent is adsorbed by the reformed layer. It is thus desirable to perform the C/C treatment while both the surface-active agent and the alkali component are present in the cleaner conditioner solution.

While it is preferable that the C/C treatment step is carried out after the ozone treatment step, the ozone treatment step and the C/C treatment step can be carried out at the same time as the case may be. In this case, a mixture of the ozone solution and the cleaner conditioner solution is prepared, and the resin board is immersed in the mixed solution, or the mixed solution is applied by spraying to the resin board. In this case, the reaction between ozone and the resin board becomes a rate-determining step, and therefore the process time is determined depending on the ozone concentration in the mixed solution. The C/C treatment step may be followed by a step of washing the resin board with water and removing the alkali component.

The adsorption step is a step of bringing the reformed layer into contact with a solution of a metal compound containing colloidal particles and/or ions of a catalyst metal, so that the metal compound solution is admitted into the reformed layer so as to form a resin-metal composite layer. Since polar groups are formed on the reformed layer through cleavage of molecular chains of the resin, for example, the colloidal particles and/or ions of the catalyst metal are attached to the polar groups, whereby the resin-metal composite layer is formed.

While alkaline solutions containing metal complex ions and acidic solutions containing metal colloidal particles are known and either of these solutions may be used as the metal compound solution, it is preferable to use alkaline solutions having metal particles of a smaller size, because the small-sized metal particles are more likely to be admitted into and dispersed in the reformed layer, thus assuring improved adhesion strength of the resulting plating film to the reformed layer. The catalyst metal, which serves as a catalyst when electroless plating is conducted, is typically Pd, but Ag, or the like, may be used as the catalyst metal.

To bring the reformed layer into contact with the metal compound solution, the metal compound solution may be applied by spraying to the surface of the resin board on which the reformed layer is formed, or the resin board may be immersed in the metal compound solution. As a result, the metal compound solution spreads from the surface of the reformed layer and penetrates into the reformed layer, and the ions or colloidal particles of the metal compound are attached to the polar groups of the reformed layer, so that the metal compound is converted through reduction into fine metal particles on the order of nanometers, to thus form the resin-metal composite layer.

The thickness of the resin-metal composite layer is preferably in a range of 10 to 200 nm. If the thickness is less than 10 nm, it is difficult for the resulting resin board to exhibit electrical conductivity. If the thickness is greater than 200 nm, it is difficult to remove portions of the resin-metal composite layer located between wires during etching as described later, causing a problem of insufficient or faulty insulation. If the thickness of the resin-metal composite layer is controlled to be within the range of 10 to 200 nm, the unnecessary portions of the resin-metal composite layer can be easily removed by etching, and a fine wiring pattern having L/S=10/10 μm or less can be formed.

In the subsequent plating step, a wiring portion is formed by performing a plating process on the resin-metal composite layer in a predetermined pattern. To form the predetermined pattern, a resist may be initially formed, and then a plating process may be conducted. The wiring portion may be plated with Cu or Ni. Where the wiring portion is plated with Ni, for example, it is further plated with Cu. The heat treatment step as described above may be carried out after the plating step.

To form the wiring portion, a resist pattern may be preliminarily formed on the resin board, and a resin-metal composite layer may be formed only on the wiring portion. In this case, a wiring board can be produced with the resist left thereon. Another method has the following steps of forming a resin-metal composite layer over the entire area of the surface of the resin board, conducting electroless plating, forming a certain pattern with a resist, conducting electroplating, and removing the resist and removing the electroless plating other than the wiring portion. A still another method has the following steps of: forming a resin-metal composite layer over the entire area of the surface of the resin board, conducting electroless plating and electroplating, then forming a certain pattern with a resist, removing the plating of a portion on which no resist exists, and then removing the resist. In these cases, since the resin-metal composite layer of the invention has a small thickness, the resin-metal composite layer located in an unnecessary portion of the pattern can be easily removed by etching, and insufficient or faulty insulation can be avoided in advance.

There is no limitation to the conditions on the plating process, and the plating process may be performed in a manner similar to those of conventional plating processes. For etching, selected portions of the resin-metal composite layer may be physically removed by, for example, polishing, or may be subjected to acid etching, or may be dissolved by a reverse electrolytic method.

After the plating step, a heat treatment step is desirably carried out in which the resin board is heated at 100 to 210° C. As a result, a curing reaction proceeds in the interior of the resin board, and the particles of catalyst metal are firmly retained in the resin matrix, thus assuring further improved adhesion strength of the plating film.

In the following, the present invention will be more specifically described with reference to some examples of the invention and comparative examples.

EXAMPLE 1

(1) Half-curing Heat Treatment Step: A resin board consisting of aromatic cyanate compound ("BA230S75" manufactured by LONZA Japan Ltd.), resin ("828EL" manufactured by Japan Epoxy Resins Co., Ltd.) containing aromatic epoxy resin, spherical silica and methyl ethyl ketone as a solvent, was prepared and heated at 150° C. for 30 min., into a half-cured state.

(2) Ozone Treatment Step: The resin board in the half-cured state was subjected to ozone treatment in which the board was immersed in an ozone solution containing 40 PPM of ozone, and held in the ozone solution at room temperature for 4 min. As a result of analyses of the surface of the resin board before and after the ozone treatment step with FT-IR (Fourier Transform Infrared Spectrometer), absorption peaks derived from carbonyl groups (—C=O) and hydroxyl groups (—OH) were observed on the surface of the resin board after the ozone treatment step.

(3) C/C Treatment Step: The resin board obtained after the ozone treatment step was immersed for 5 min. in a cleaner conditioner solution ("OPC-370 CONDICLEAN" manufactured by OKUNO CHEMICAL INDUSTRIES CO.,LTD.) heated to 65° C.

(4) Catalyst Adsorption Step: After the resin board resulting from the C/C treatment step was washed with water and dried, the resin board was immersed at 40° C. for 5 min. in an alkaline catalyst ("OPC-50 INDUCER A and C" manufactured by OKUNO CHEMICAL INDUSTRIES CO., LTD.) containing Pd complex ions, and then immersed at room temperature for 6 min. in a Pd reducing liquid ("OPC-150 CRYSTER MU" manufactured by OKUNO CHEMICAL INDUSTRIES CO., LTD.).

As a result of analysis of a section of the obtained wiring board with TEM, it was found that Pd was concentratedly distributed in a range from the surface to a depth of 70 nm, and it was confirmed that a resin-metal composite layer having a thickness of 70 nm was formed.

(5) Electroless Plating Step: The board obtained in the manner as described above was immersed in a Cu chemical plating bath kept at 32° C., and a Cu plating film was deposited on the board for 20 min. The thickness of the deposited Cu plating film was 0.5 μm.

(6) Heat Treatment Step: The board thus obtained was heated at 105° C. for 30 min., and then heated at 150° C. for 30 min.

(7) Pattern Forming Step: Subsequently, a photoresist was applied to the board, and a pattern was formed through exposure and development processes.

(8) Electroplating Step: Subsequently, current was applied at a current density of 3 A/dm2 to the board for 45 min. in a copper plating path, so that a Cu plating film having a thickness of 25 μm was further formed on the wiring pattern. Thereafter, the photoresist was removed by a chemical agent, and the board was heated at 180° C. for 120 min. so as to be fully cured, to provide a printed wiring board. Thereafter, unnecessary chemical Cu plating portions located between wires were removed using an etching liquid. On the printed wiring board was formed a fine wiring pattern having L/S=10/10 μm.

EXAMPLE 2-EXAMPLE 6

Printed wiring boards of Examples 2 to 6 were obtained in substantially the same manner as that of Example 1, except that the duration of time that the board was immersed in the ozone solution in the ozone treatment step was 8 min., 12 min., 16 min., 20 min. and 24 min., respectively.

COMPARATIVE EXAMPLES

Printed wiring boards of Comparative Examples were obtained in substantially the same manner as those of Examples 1 to 6, except that a resin board formed from epoxy resin ("ABF-GX13" manufactured by AJINOMOTO CO., INC.) was used as the resin board.

Test and Evaluation

With regard to each of the printed wiring boards of Examples 1 to 6 and Comparative Examples, the adhesion strength of the plating film was evaluated by measuring the peel strength defined by JISH8504. The results of the measurements are shown in FIG. 1 and FIG. 2.

Figure 2:
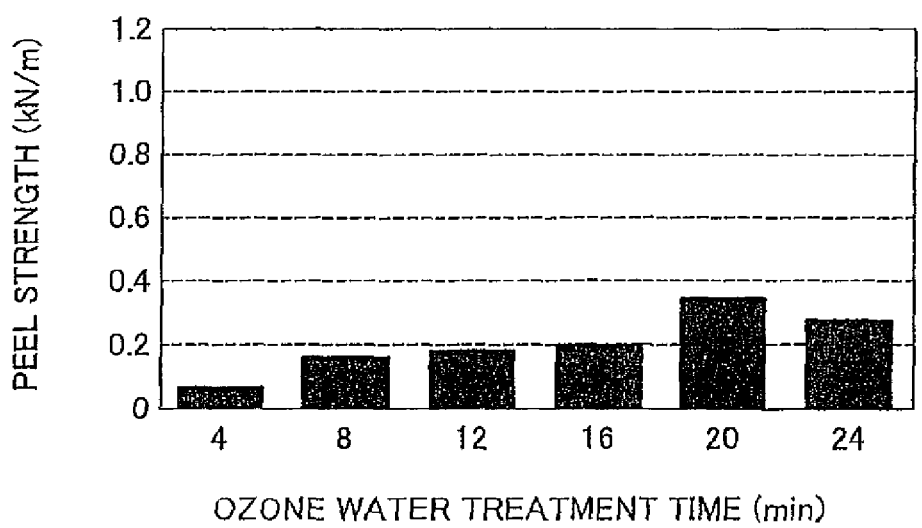
FIG. 2 is a graph showing the adhesion strength of plating films of printed wiring boards obtained in Comparative Examples.

It is apparent from FIGS. 1 and 2 that the plating films of the printed wiring boards of Examples 1 to 6 according to the invention have higher adhesion strength than those of Comparative Examples, owing to the effect of the use of the resin board formed from the resin containing the aromatic cyanate compound and the aromatic epoxy resin having the epoxy group.

It is understood from comparisons of Examples 1 to 6 that the adhesion strength improves as the ozone treatment time increases up to 12 min. It is found, from another analysis, that the thickness of the resin-metal composite layer increases as the ozone treatment time increases. Thus, it may be considered that the adhesion strength is improved because of the increase of the thickness of the resin-metal composite layer.

It is also recognized from FIG. 1 that the adhesion strength gradually decreases as the ozone treatment time further increases to be equal to or longer than 16 min. The reduction in the adhesion strength is caused by a cohesive failure of the resin itself due to the progression of degradation of the resin board during the ozone treatment, but not caused by peeling at the interface between the plating film and the resin board.

According to the method of producing the wiring boards of Examples 1 to 6, the plating film has an adequate adhesion strength from a practical standpoint, even if the thickness of the resin-metal composite layer is equal to or less than 200 nm. Accordingly, unnecessary portions of the resin-metal composite layer located between wires can be easily removed by etching, and a fine wiring pattern can be formed without causing a problem of insufficient or faulty insulation.

Since the ozone treatment is employed, the surface roughness measured at the wiring portion of the wiring board of the invention is 0.05 μm in Ra value, and 1.0 μm in Rz value. Thus, the wiring portion of the wiring board of the invention has high smoothness, and exhibits excellent high-frequency characteristics.

The invention claimed is:

1. A method of manufacturing a wiring board, wherein the wiring board comprises:
   a resin board treated with an ozone solution, the resin board comprising a mixture of a plurality of types of resins, the mixture containing an aromatic cyanate compound and an aromatic epoxy resin,
   a resin-metal composite layer which is formed integrally on a surface of the resin board and in which fine metal particles are uniformly dispersed in a resin matrix; and
   a wiring portion that comprises a plating film formed in a predetermined pattern on the resin-metal composite layer, wherein
   the resin-metal composite layer has a thickness of 10 to 200 nm and the wiring portion includes a fine wiring pattern having L/S =10/10 μm or less,
   the method comprising:
   an ozone treatment step of treating the resin board with the ozone solution so as to form a reformed layer having polar groups on a surface thereof;
   an adsorption step of bringing the reformed layer into contact with a metal compound solution so that at least one of colloidal particles and ions of a catalyst metal are attached to the polar groups and fine particles of the catalyst metal are dispersed in the reformed layer, thereby forming the resin-metal composite layer;
   a plating step of performing a plating process on the resin-metal composite layer so as to form the wiring portion;
   a heat treating step of heating the resin board; and
   an etching step of removing an unnecessary portion of the resin-metal composite layer other than the wiring portion, wherein
   the ozone treatment step, the adsorption step and the plating step, the heat treatment step, and the etching step are carried out in the order of description.

2. The method according to claim 1, wherein the aromatic cyanate compound is selected from the group consisting of bisphenol A dicyanate, polyphenol cyanate (oligo (3-methylene-1,5-phenylenecyanate)), 4,4'-methylenebis (2,6-dimethyl-phenylcyanate), and 4,4'-ethylidenephenyldicyanate, hexafluorobisphenol A dicyanate.

3. The method according to claim 1, wherein the aromatic epoxy resin is selected from the group consisting of bisphenol A type epoxy resin, bisphenol F type epoxy resin, bisphenol S type epoxy resin, phenol novolak type epoxy resin, alkylphenol novolak type epoxy resin, biphenyl type epoxy resin, dicyclopentadiene type epoxy resin, epoxides of condensation compounds of phenols and aromatic aldehyde having a phenolic hydroxyl group, naphthalene type epoxy resin, triglycidyl isocyanurate, brominated epoxy resins thereof, and phosphorous modified epoxy resins thereof.

* * * * *